United States Patent
Breuer et al.

(10) Patent No.: US 6,409,072 B1
(45) Date of Patent: Jun. 25, 2002

(54) CHEMICAL MICROREACTORS AND METHOD FOR PRODUCING SAME

(75) Inventors: Norbert Breuer, Ditzingen; Heinrich Meyer, Berlin, both of (DE)

(73) Assignee: Atotech Deutschland GmbH, Berlin (DE)

(*) Notice: Subject to any disclaimer, the term of this patent is extended or adjusted under 35 U.S.C. 154(b) by 0 days.

(21) Appl. No.: 09/380,055

(22) PCT Filed: Feb. 17, 1998

(86) PCT No.: PCT/DE98/00519

§ 371 (c)(1),
(2), (4) Date: Oct. 25, 1999

(87) PCT Pub. No.: WO98/37457

PCT Pub. Date: Aug. 27, 1998

(30) Foreign Application Priority Data

Feb. 20, 1997 (DE) .......................................... 197 08 472

(51) Int. Cl.⁷ .................................................. C03F 1/20
(52) U.S. Cl. .................... 228/111.5; 156/60; 216/56; 228/164; 422/129; 427/247; 427/309; 427/327; 427/328
(58) Field of Search ............................ 422/68.1, 81, 99, 422/103, 104, 129, 130, 131, 138; 216/2, 56, 83, 96, 94, 95, 100; 156/60, 345; 228/101, 111.5, 164, 165, 199

(56) References Cited

U.S. PATENT DOCUMENTS 5,534,328 A * 7/1996 Ashmead et al.
5,658,537 A * 8/1997 Dugan
5,698,299 A * 12/1997 Schmidt et al.
5,856,174 A * 1/1999 Lipshutz et al.
5,922,591 A * 7/1999 Anderson et al.

FOREIGN PATENT DOCUMENTS

| DE | 3011282 | * 10/1981 |
| EP | 212245 | * 7/1986 |
| EP | 212878 | * 3/1987 |
| EP | 292245 | * 5/1988 |
| WO | PCT/CH92/00035 | * 9/1992 |

OTHER PUBLICATIONS

"Hetergeneous Catalyzed Reactions in a Microreactor", D. Honicke, g. Wiesmeier, DECHEMA Monographs vol. 132, pp. 93–107 (Undated).*

Deep X–Ray Lithography for the Production of Three–Dimensional Microstructures From Metals, Polymers and Ceramics, W. Dhrfeld, H. Lehr, Radiat. Phys. Chem., vol. 45 (1995), pp. 349–365.*

(List continued on next page.)

Primary Examiner—Joseph W. Drodge
(74) Attorney, Agent, or Firm—Paul & Paul

(57) ABSTRACT

Chemical microreactors for chemical systhesis and their methods of manufacture are known, but have disadvantages such as extremely high manufacturing costs or poor flexibility for adaptation to various cases of application. These disadvantages are avoided by means of the microreactors and manufacturing methods according to the invention. The microreactors are characterized in that the reactors contain fluid ducts in at least one plane as well as feed and return lines for fluids, wherein the fluid ducts are defined by side walls of metal opposing each other and further side walls of metal or plastic extending between said side walls, and in which the planes are connected together and/or with a closure segment closing open fluid ducts by means of appropriate solder or adhesive layers. The manufacturing method is characterized by process sequences in which the individual reactor planes produced by means of electrolytic methods, are connected together by soldering or gluing.

21 Claims, 5 Drawing Sheets

OTHER PUBLICATIONS

Potentials and Realizations of Microreacotors, W. Ehrfeld et al, DECHEMA Monographs vol. 132, pp. 1–29 (Undated).*

Microfabricated Minichemical Systems: Technical Feasibilty, J. J. Lerou et al, DECHEMA Monogrphs, vol. 132, pp. 51–69 (Undated).*

Die Mikrosystemtechmik und ihre Mikrosystemtechnik, Automatisierungstechnische Praxis, W. Menz Spektrum der Wissenschafz Feb. 1904, pp. 92–99 (Undated).*

"Die Industrielle Anwendung der Mikrosystemtechnik", W. Menz, Automatisierungstechnische Praxis, Nov. 1995, pp. 12–22.

* cited by examiner

A

B

C

D

E

F

CHEMICAL MICROREACTORS AND METHOD FOR PRODUCING SAME

BACKGROUND OF THE INVENTION

The invention relates to chemical microreactors which can be used in the chemical industry amongst other things for synthesizing processes, to methods for their manufacture and to a preferred use of the microreactors.

There have been reports for a number of years in the literature relating to chemical micro reactors which have advantages in comparison with previous production systems for manufacturing chemical compounds. With the conversion of chemical methods into a large industrial production scale there is the basic problem that the dimensions of the production systems are larger by several orders of magnitude than the apparatus used on a laboratory scale for developing the processes. If for example a chemical synthesis is considered, then the relevant scale of size of the chemical species reacting with one another is determined by their molecular size, which generally is in the range of below one nanometer up to a few nanometers. For diffusion and heat transfer phenomena lengths of a few millimeters down to the micrometer range are relevant. Due to the production volumes required in large-scale industry, chemical reactors usually have dimensions which lie in the range between a few centimeters up to several meters. Therefore at least for homogeneous chemical reactions the experience gained on a laboratory scale with reaction volumes of a few liters up to about 100 liters relating to the process management, cannot be directly adopted on an industrial scale. Already with mixing liquids, a stirring mechanism is primarily necessary in order to increase the transport of materials in such a way that the distances between areas of differing concentration are reduced. The so-called scale-up problem also arises from the various dimensions of the reactor. A chemical reaction which has been optimised on the laboratory scale thereafter cannot immediately be transferred to the production system, but must be firstly transferred to a pilot system of dimensions between the laboratory and production scales (technical college scale), before it is finally used in industrial production. A problem is that each stage of this process development requires its own cycle of optimization, each of these cycles being additively involved in the development time required for introduction of the process. In heterogeneous catalysis on the other hand, the catalyst particles are often applied to porous carriers, whose pore size lies in the range of order of magnitude (millimeter to micrometer range) relevant for the transport of materials.

When the process control is not at its optimum and based purely on knowledge from the laboratory scale, for example the yield of the chemical synthesis can be too small, as excessively large proportions of undesired secondary products are formed due to secondary reactions which are preferably taking place.

In order to solve the above problems in transferring a process from the laboratory scale to the production scale, the concept of so-called microreactors was developed a few years ago. This involves a parallel arrangement of a plurality of reaction cells, whose dimensions extend from a few micrometers up to a few millimeters. These reaction cells are formed such that therein physical, chemical or electrochemical reactions can take place. In contrast to a conventional porous system (heterogeneous catalysis), the dimensions of the cells in a microreactor are defined, i.e. produced according to plan in accordance with a technical process. Even the arragement of the individual reaction cells in the ensemble of the reactor is likewise ordered, in particular periodically in one or two dimensions. The necessary feed (inlet) and return (outlet) structures for the fluids (liquids and gases), and sensors and actors, for example valves, cooling and heating members, which influence or monitor the flow of material and heat in the individual cells also belong to the reactors in the extended sense.

One individual reactor cell has a lateral extension which lies in an order of magnitude favourable for optimum transport of material and heat. As the volume flow through one individual reactor cell is extremely small, the entire reactor is enlarged (scale-out) by parallel multiplication of these elementary cells to the industrially necessary size. Due to the small dimensions, local differences of concentration and temperature in the fluid flows are reduced to a minimum. Thus, the processes may be much more accurately adjusted to the optimum reaction conditions, so that the conversion rates in a chemical reaction can be increased for an identical duration time of the reaction medium in the reactor. In addition, the purity and yield of the synthesized materials can be optimized by setting the approximately most favourable reaction conditions. In this way such chemical reactions can also be realized, which were not manageable in the previous way, such as intermediate products by trapping in a controlled manner.

There are a series of proposals for manufacturing the chemical microreactors.

On the one hand a microreactor can be produced for example by stacking a plurality of copper foils, in which grooves are machined by means of a diamond tool in order to form flow ducts. Such a microreactor which is used for partial oxidation of propene to form acrolein is described by D. Hönicke and G. Wiesmeier in the article "Heterogeneous Catalyzed Reactions in a Microreactor" in DECHEMA Monographs, Volume 132, Papers of the Workshop on Microsystem Technology, Mainz, 20 to 21, February 1995, pages 93 to 107. The individual reactor layers are connected together by diffusion bonding and subsequent electron beam welding. For carrying out the chemical reaction it was necessary for the copper inside the originating ducts to be converted into red copper oxide by partial oxidation.

For a precise and reproducible manufacture of the fine structures, a micro-positioning table suitable for such purposes is required. Basically the individual reaction cells are produced serially and thus in a time- and-cost-intensive way.

By means of the LIGA process (Lithographie, Galvano-Formung, Abformung=lithographie, electroforming, shaping), a plastic layer, usually polymethylmethacrylate (PMMA) is exposed by means of synchrotron radiation and is subsequently developed. The structure produced in this way is electrolytically filled up with a metal. Then the metal structure can be again duplicated in further process steps by means of a plastic replication. Such a method is described by W. Ehrfeld and H. Lehr in Radiat. Phys. Chem., Volume 45 (1995), pages 349 to 365, and W. Menz in Spektrum der Wissenschaft, February 1994, pages 92 to 99 and W. Menz in Automatisierungstechnische Praxis, Volume 37, (1995), pages 12 to 22. According to the details in the scientific paper in Spektrum der Wissenschaft loc. cit., individual components or subsystems, which are produced separately, are connected together by suitable jointing techniques.

A technique related to the LIGA process, which operates without the extremely expensive synchrotron radiation, is the so-called laser-LIGA method. In this case the plastic layer of PMMA is structured by a powerful UV laser and then electrolytically duplicated as in the LIGA process (W.

Ehrfeld et al., "Potentials and Realization of Microreactors" in DECHEMA Monographs, Volume 132, pages 1 to 29).

W. Menz in Automatisierungstechnische Praxis, loc. cit. also proposes a modified method according to which a microelectronic circuit has been formed on a silicon substrate in a previously known way, firstly a protective layer, thereupon an entire-surface metallizing layer and thereon a plastic moulding compound are deposited. Then, by means of a metal matrix which has been produced according to the LIGA process, the image of the fluid duct structures is impressed into the moulding compound. Thereafter the residual layers of the moulding compound covering the metal layer in the recesses formed are removed by plasma etching, and metal is deposited electrochemically in the recesses. The plastic structures are then removed and the exposed metal areas of the basic metallisation are removed by etching.

Both the previous LIGA process and the laser-LIGA process are extremely expensive, as they require very expensive devices for structuring the plastic layer (synchrotron radiation source).

From the previously mentioned scientific paper by W. Ehrfeld et al., "Potentials and Realization of Microreactors", there is also known a method of manufacturing chemical microreactors in which a photosensitive glass, for example FOTURAN® (Schott Glaswerke, Mainz) is used. For this purpose an image of the structure to be produced is transferred by UV light on to the glass member. By means of a subsequent heat treatment only the exposed areas in the glass crystallize. Thereafter, these can be preferably etched away in a hydrofluoric acid solution. This method has the advantage that the reaction ducts can be rapidly reproduced due to the parallel light exposure and the etching process. However, only certain glasses can be used, so that this manufacturing method on the one hand is expensive and on the other hand is particularly restricted to only a few cases of application.

Also the methods, which have been developed in the semiconductor industry for structuring silicon surfaces, have been taken over for manufacturing microreactors. For example, a method has been described by J. J. Lerou et al. in the scientific paper "Microfabricated Minichemical Systems: Technical Feasibility", DECHEMA Monographs, Volume 132, pages 51 to 69, in which three etched silicon wafers and two end wafers at the outer sides are connected together. Further, a heat exchanger filled with polycrystalline silver particles, which was likewise designed as a microreactor, was used. Also this method may only be used to a restricted degree, as only silicon can be used.

A method of manufacturing plate heat exchangers is described in EP 0 212 878 A1. According to this, the duct structures required for the heat exchanger are formed by means of a mask (screen printing, photo printing) on plates of steel, stainless steel, brass, copper, bronze or aluminium, and the ducts themselves are produced in the surface areas not covered by the mask by a chemical etching process. Afterwards a plurality of these plates are connected together in a diffusion bonding process. Such a heat exchanger, formed from plates welded together by diffusion bonding, is also disclosed in EP 0 292 245 A1.

The previously known methods for manufacturing microreactors therefore have many disadvantages, among which is the fact that structured metal surfaces can only be produced in the reactor, by means of a time-intensive and/or cost-intensive method or glass and silicon, respectively can exclusively be used, which are not well suited for specific applications.

The reactors according to EP 0 212 245 A1 and EP 0 292 245 A1 have the further disadvantage that with the configuration shown, only heat exchangers can be manufactured, so that many possible applications for chemical microreactors cannot be considered at all. In particular, complex reactors which have in addition to this ducts also electronic semiconductor circuits, fiber optic wave guides and other elements such as actors and sensors cannot be produced by this method.

SUMMARY OF THE INVENTION

Hence, the object of the present invention is to manufacture chemical microreactors which are suitable for a plurality of different applications and which are equipped with different and possibly complex elements such as electronic switching circuits, optic fibre wave guides, actors and sensors as well as catalytic corrosion-protective layers and other functional layers in the ducts. Further the manufacturing process is intended to be cost-effective and capable of being rapidly carried out. In particular, it is also intended to be possible to produce such microreactors in large numbers.

The problem is solved by the methods according to the claims 1 to 3 and by the chemical microreactor according to claim 16.

For solving the problem three manufracturing methods to manufacture chemical microreactors,have been founded which comprise at least one substrate with fluid ducts and feed (inlet) and return (outlet) lines for fluids (gas, liquid). The methods operate without using plastic shaping processes and include the following procedure steps:

Etching Method:
 a. formation of fluid duct structures on the. metal surfaces located on the substrate by means of a photoresist layer or a screen-printed varnish layer, so that the metal surfaces are partly covered by the layer;
 b. at least partly electroless and/or electrochemical etching-off of metal from the exposed surfaces of the substrate;
 c. total removal of the photoresist layer or screen-printed varnish layer;
 d. formation of adhesive and/or solder layers;
 e. superimposing of the substrates and a closure segment closing the fluid ducts, and interconnecting the substrates and of the closure segment by gluing and/or soldering.

Reversal Method:
 a. formation of fluid duct structures on metal surfaces located on the substrate by means of a photoresist layer or a screen-printed varnish layer, so that the metal surfaces are partly covered by the layer;
 b. electroless and/or electrochemical deposition of a metal layer on the exposed surfaces of the substrate;
 c. total removal of the photoresist layer or screen-printed varnish layer;
 d. at least partial electroless and/or electrochemical etching-off of the metal from the substrate, forming fluid ducts;
 e. formation of adhesive and/or solder layers;
 f. superimposing of the substrates and a closure segment closing the fluid ducts, and interconnecting of the substrates and the closing segment by gluing and/or soldering.

Additive Method:
 a. formation of fluid duct structures on the substrate by means of a photoresist layer or a screen-printed varnish layer, so that the substrate surfaces are partially covered by the layer;

b. deposition of a metal layer on the exposed surfaces of the substrate;

c. total removal of the photoresist layer or screen-printed varnish layer;

d. formation of adhesive and/or solder layers;

e. superimposing of the substrates and a closure segment closing the fluid ducts and interconnecting the substrates and the closure segment by gluing and/or soldering.

The chemical microreactors according to the invention have the following features:

a. fluid ducts in at least one plane;

b. feed (inlet) and return (outlet) lines for fluids;

c. the fluid ducts are defined by side walls of metal facing one another and by further side walls of metal or plastic extending between these side walls;

d. different planes of fluid ducts are interconnected and/or connected with a closure segment closing open fluid ducts, by means of appropriate layers of solder and/or adhesive.

An advatagerus use of the chemical microreactors is indicated in claim 20.

According to this the chemical microreactors are suitable for manufacturing toxic, unstable or explosive chemical products, particularly of cyanogen chloride, phosgene, ethylene oxide, selenium compounds, mercaptanes, methyl chloride, methyl iodide, dimethyl sulphate, vinyl chloride and phosphines.

Advantagerus aspects of the invention are indicated in the dependent claims.

By using industrial electrolytic methods for manufacturing the individual reactor planes, an extremely flexible adaptation to the respective case of application is possible by means of the selection of appropriate combinations of materials for the planes.

In addition, the opportunity of integrating the connection of the structured reactor planes into an overall process is also afforded, in order to be able to produce stacked reactors. There is no application of diffusion welding process representing a high heat brad for the reactor members as with the use of copper foils or anodic bouding process as with the use of silicon wafers. Rather, the individual reactor planes are connected together by soldering or gluing. In this way individual planes of the microreactor can be joined into stacks already with medium heat load on the substrates, so that temperaturesensitive substrates as well as temperature-sensitive reactor elements already integrated before joining, for example semiconductor circuits or swellable gels for forming actors, can be used. The soldering temperature can also be reduced to small values by the selection of specific solders, or the strength of the stack can be set at high values by the selection of specific hard solders. By selecting low meeting points solders or by means of gluing it is possible to prepare even temperature-sensitive substrate surfaces for use in the chemical synthesis before joining of the reactor planes.

The inner surface of the reactor according to the invention can still be chemically or structurally altered even after combination, and thus can be optimized in accordance with the requirements of the specific chemical process. In addition to the metal layers, furthermore it is also possible to integrate any plastic layers into the reactor, as composite materials of metals with plastics are available almost unlimited. Thus the materials used can be adapted to the specific requirements of the respective case of application.

The fabricable ducts can be manufactured in an extremely uniform manner. The formation of burrs as occurs with mechanical scribing copper foils and tool wear do not occur. The dimensions of the fluid ducts are preferably in the range of 1 millimeter or less. For example, fluid ducts with an approximately rectangular cross-section can be produced even with a width of 100 $\mu$m and a height of 40 $\mu$m. In particularly preferred embodiments of the invention, the fluid ducts have structural heights of 300 $\mu$m and less. Where the cross section of the ducts is not rectangular, the width dimensions are intended to relate to width dimensions measured at half the height of the ducts. For example, ducts with an approximately semicircular concave cross section can also be produced.

A further substantial advantage resides in that all the reactor planes may be produced simultaneously. It is not necessary to sequentially pass through the individual process stages. As the individual duct planes or modules can be substantially produced simultaneously, the entire reactor can be produced with less tolerances. In addition, a high degree of reproducibility of the basic structures is enabled.

The reactors produced are inexpensive, as no excessively complex devices are necessary for the manufacturing process. The resist structures formed in the LIGA process have in fact an extreme edge steepness and a very high aspect ratio. While these properties are essential for the production of micromechanical components for which this method was originally developed, they are not necessary for the manufacture of chemical microreactors. By avoiding the expensive synchrotron radiation or the expensive UV laser devices and the expensive masks required thereto, structures can be produced photolithographically or even by means of screen-printing, by means of which the requirements of the average dimensions in microreactors are satisfied.

Compared with the heat exchangers or the manufacturing process described in EP 0 212 878 A1 and EP 0 292 245 A1, the reactors and the manufacturing process according to the invention have the advantage that temperaturesensitive materials can be used, as the diffusion bonding process is not used. In particular, semiconductor circuits, fiber optic wave guides, actors and sensors as well as temperature-sensitive coatings can already be integrated into the reactor before its combination. This leads to a substantial expansion of the possible field of application and simplification with the design and fabrication strategy for the reactors.

For the reasons mentioned above, the method according to the invention may be used with extraordinary flexibility. The individual members can be manufactured in large numbers, cost-effectively and with a high degree of dimensional accuracy.

By chemical microreactors are to be understood devices with fluid ducts from at least one reactor layer, which also have auxiliary zones serving for mixing, metering, heating, cooling or analysing the initial materials, the intermediate products or the end products in addition to the actual reaction zones, if necessary. Each zone is characterized by a structure adapted to the respective requirements. Whilst heating and cooling zones are designed either as heat exchangers or as reactor compartments equipped with electrical resistive heating systems and electrical cooling elements, respectibely, and analysis zones have adapted sensors, metering zones contain microvalves and mixing zones, for example, such as ducts with appropriately shaped inserts for swirling the combined fluids. The structure of the microreactors according to the invention can also be designed for specific cases of application in such a way that only heat is transported from or to the fluidic medium, for example in that heat is exchanged between the medium to be heated or cooled and another heating or cooling medium.

The fluid ducts in the individual reactor layers are generally closed by stacking a plurality of layers on top of the others, and by closing the last layer with a closure segment.

Various substrates can be used to manufacture the microreactors: on the one hand, metal foils are suitable for this, for example steel, stainless steel, copper, nickel or aluminium foils. The thickness thereof should be within a range of 5 µm to 1 mm. Foils with a thickness of less than 5 µm are less suitable, as therein ducts with a sufficient width cannot be formed. If a pure metal foil is used as a substrate, then in the case of such low metal layer thicknesses there arises the further problem that these foils now only are extremely difficult to handle. On the other hand foils with a thickness of more than 1 mm would lead to a thick reactor stack.

In addition, plastics, ceramics or glass films metal coated on one or both sides may also be used as a substrate. For example, epoxy resin or polyimide laminates lined with copper foils are suitable. An opportunity of producing the plastic foils coated with metal also resides in the fact to metallizeing them by known chemical methods. F or this purpose firstly a surface treatment by means of chemical or physical methods has to be provided with the foil, being roughened for example in etching solutions or by means of a plasma discharge using appropriate gases. Thereupon, after an appropriate further pre-treatment, such as cleaning, conditioning and activation, the plastic films are metallized with an electroless and/or electrochemical method. The strength of the plastic layer, particularly of epoxy resin, is frequently increased by embedding glass fibre or aramide fabrics. Another possibility resides in pressing plastic s and metal foils together under pressure and temperature effects (lamination).

Other chemically resistant materials are among others polytetrafluor-ethylene or other halogenated polyalkanes. Such chemically resistant materials can for example be activated by plasma-enhanced chemical gas phase (vapor) deposition (PECVD). For example securely-adhering nickel-phosphorus or copper layers can be formed by electroless metal deposition on such activated surfaces. Securely adhering coating glass or ceramic materials is also directly possible according to known methods, for example by alkaline etching before activation and electroless metallization. By means of coating the chemically resistant plastics with metals, these materials can more simply be connected together in a securely adhering manner. Such a composite of polytetrafluorethylene films is not directly possible with laminates being not metallized.

Various methods can be used to form the fluid ducts. In one procedure substrates coated all-over with a metal such as copper are taken as starting point. The methods being suitable for this purpose to form the ducts have been previously shown diagramatically. According to another process variant, the fluid ducts may also be generated by additive build-up of the metal layers exclusively in the areas on the substrates which do not correspond to the duct structures. The methods according to the invention are likewise available for this purpose.

In order to obtain sufficiently deep fluid duct structures, the thickness of the metal layer to be etched off or deposited must be sufficiently thick. As there are frequently problems with uniform production of thick metal layers, particularly on large-area substrates, small substrate blanks are preferably used, upon which the ducts are formed.

To form the fluid ducts by the etching method, the resist layer (screen-printed or photoresist layer) is applied on the substrate surfaces such that the surface areas forming the fluid ducts are not covered by the resist layer.

For an additive production of the fluid ducts, it is also possible to start with films being not coated with metals. In this case firstly a screen printed layer or a photoresist layer is applied to the foils surfaces in such a way that the surface areas corresponding to the fluid ducts are covered by the resist. The same also applies in the case of the reversal method. In order to enable electroless metal deposition when the additive technique is used, the film surfaces must first be subjected to a pretreatment in an appropriate way. For this purpose the same methods are used as for the all-over metallization of the foils. Thereupon the metal structures can be deposited in the exposed areas of the photoresist layer on the foil surfaces. For example, the typical methods from printed circuit technology can be used. In this respect express reference is made to the details relevant to this matter in the "Handbuch der Leiterplattentechnik" Volume III, ed. G. Herrmann, pages 61 to 119, 1993, Eugen G. Leuze Verlag, Saulgau, DE. The details on process technology contained therein are also usable herein and are hereby incorporated. After metal deposition, the photoresist layer is totally removed.

Liquids and gases are processed as fluids in the finished microreactors.

DETAILED DESCRIPTION OF THE INVENTION

Figure 1:
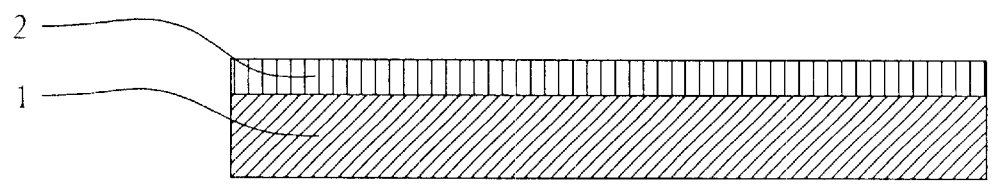
FIG. 1 shows a reversal method of forming a microreactor.
Figure 1:
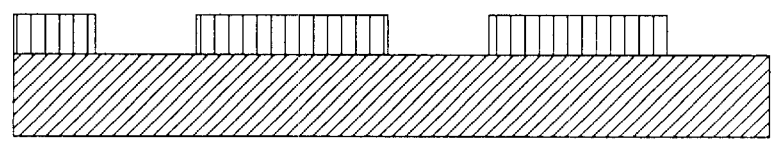
Figure 1:
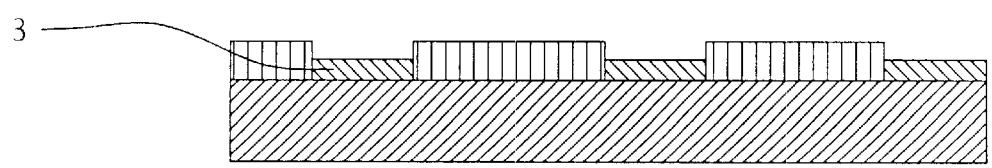
Figure 1:
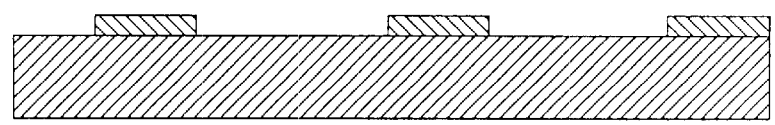
Figure 1:
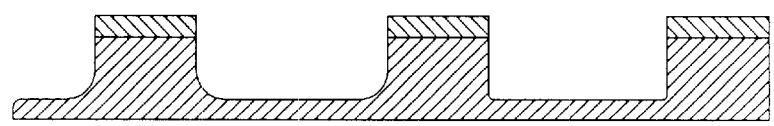
Figure 1:
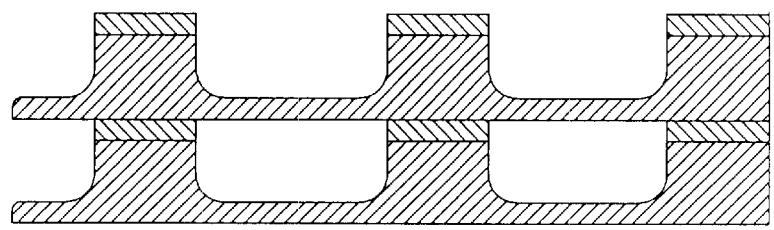

According to the method according to the invention, firstly fluid duct structures are formed on the substrates, in which a screen-printing process or in particular a photolithographic process being used. For this purpose a photoresist is applied on one or both surfaces of the foil. In the diagram of FIG. 1 there is shown by way of example a method for forming these structures (reversal method). The photoresist 2 can either be laminated as a film onto the substrate 1, or be applied as a liquid by spin-coating or curtain technique or by electrodeposition (process step A in FIG. 1). Thereafter the photoresist layer is exposed with the image of the fluid duct structure to be produced, and the structure is then worked out in a development process (process step 2).

In addition to the fluid duct structures, other functions may also be provided on the substrates. On the one hand, so-called actors and sensors can be integrated into the microreactor. The actors involve switch members, such as valves, selectlable externally or automatically by measurement signals, but also electrical resistive heating systems or cooling elements operating according to the Peltier effect. For example, valves can be formed by swellable gel plugs. Microreactors in which actors and sensors are provided may be locally optimized with appropriate connection of actors and sensors in terms of the regulation technology. At the same time, sensor outputs may also be used for external monitoring of the reactor condition (such as for example ageing, toxification of catalysts and similar parameters).

If necessary, electrical connection lines for selecting or detecting measurement signals on the substrates are also to be provided for the actors and sensors. Appropriate structuring elements must be taken into account for these elements during the photoprocess.

If substrates coated with metal are used, other elements may also be integrated in the interior of microreactors. For example, microchips for controlling actors and sensors can be integrated by providing a recess in a plastic laminate, into which the microchip is inserted. The electrical connections to the respective control and signal lines can be produced by bonding or other known joining techniques, such for example as by soldering or gluing with conductive adhesives.

Furthermore, with the formation of the structures, at the same time peripheral reactor components, such as feed lines, mixing zones, heating or cooling circuits can also be formed in addition to the reactor cells, so that the manufacturing costs are reduced. Therefore these elements are already to be provided during the photostructuring stage. Moreover, the problems of sealing which normally occur are minimized.

Figure 2:
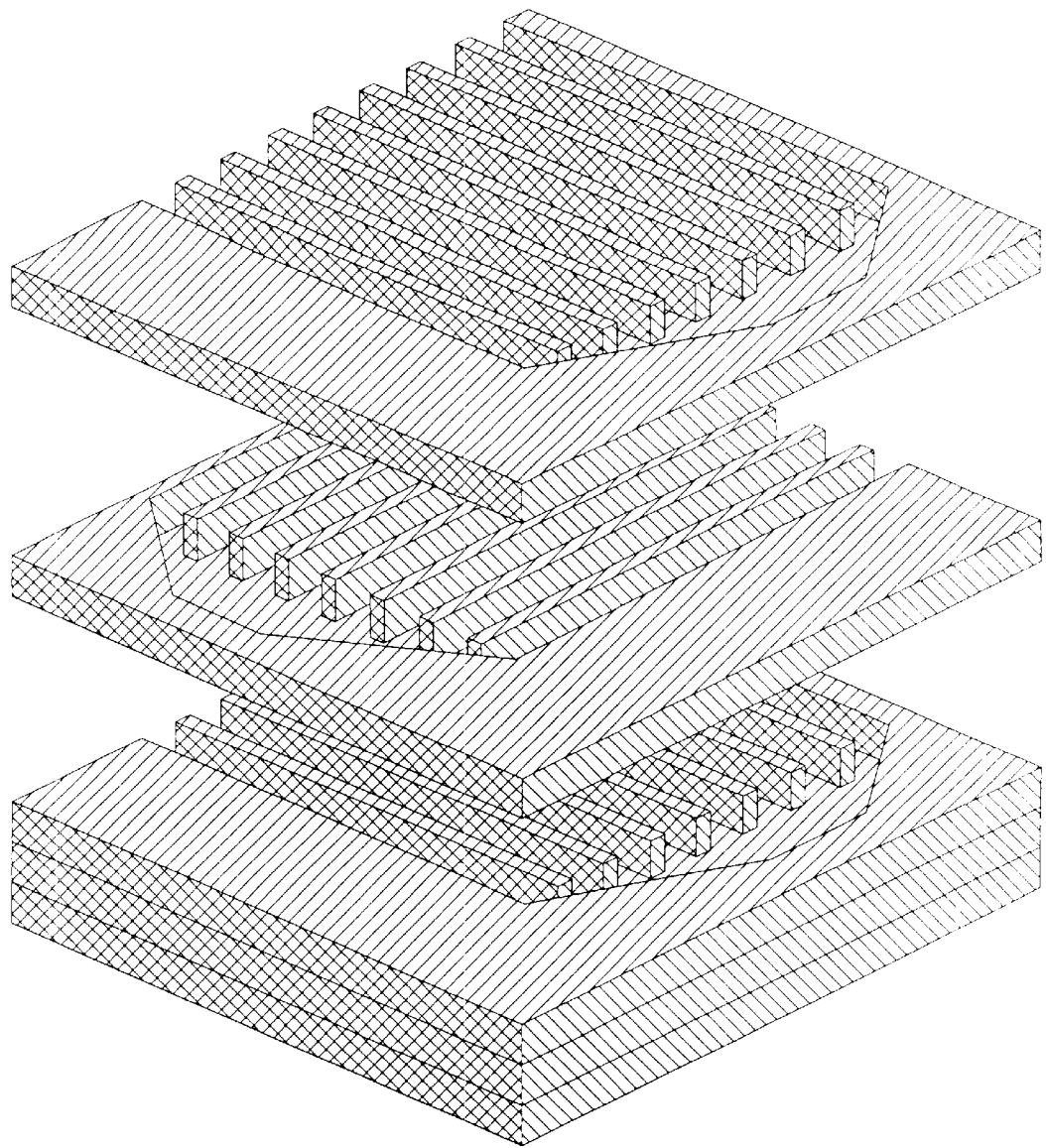
FIG. 2 shows an arrangement of a microreactor stack.

The individual planes of the reactors can preferably be produced in multiple blanks. For this purpose the individual plane images are formed on a larger panel or film as fields lying next to one another. These elements are separated from one another after completion and can then be combined in a stack. FIG. 2 shows the arrangement of a plurality of planes into a stack with identical fluid duct structures disposed crosswise to one another, the three lower planes being already connected together.

Thereupon the metal areas now exposed, which are not covered by the resist, can be further processed. For this purpose electroless or electrochemical methods are available. Preferably, either the metal of the metal foil is at least partially removed, in order to form the ducts, or further metal layers are built up on the exposed areas of the foil by electroless or electrochemical methods or by a combination of these methods (FIG. 1). In the first-named process the fluid duct structures are formed in such a way that during developing the photoresist the areas corresponding to the ducts are exposed. During the reversal process these areas on the other hand are kept covered by the photoresist, while the remaining areas not corresponding to the duct structures, are exposed.

According to a process variant of the reversal method, a metal resist layer 3, which is different from the basic metal layer, is applied on the exposed areas of the metal surface (process step C in FIG. 1). Preferably, a layer of tin, lead, lead/tin alloy, bismuth, tin/bismuth alloy, nickel or cobalt layer or an alloy of nickel and cobalt or an alloy of these elements with other elements such as boron or phosphorus are applied. By means of using these metals, the metal layers lying underneath the photoresist layers can be etched after ablation of the photoresist layer, without the metal resist layers being attacked. This method offers the advantage that the photoresist layer needs no outstanding chemical resistance to the etching solution.

After the metal layer in the exposed areas has been at least partly etched off according to the etching method, or after the metal resist layer has been applied according to the reversal method, the photoresist layer is ablated (process step D in FIG. 1). According to the reversal methode the substrates are then treated in an etching bath which affects the substrate material, but not the metal resist mask (process step E). According to the etching method, the substrate is etched after formation of the fluid duct structures in the photoresist layer. In both cases structures are worked out of the substrate in this way. The fluid ducts are formed by means of ablation of the metal of the metal foil or metal coating.

Then, a plurality of reactor planes produced in this manner are stacked one above the other and connected together (process step F).

If a solderable metal is used as a metal resist, in this method simultaneously a layer is obtained which simplifies the subsequent combination of the structured layers into a stack. A possible combination is the use of copper as a foil material or as a metal coating and tin or a tin/lead alloy as a solderable metal resist. The electrolytic application of solder containing silver, which is also used for hard soldering, is likewise possible.

When using the reversal method, another method procedure for forming such solderable layers consists in applying to the exposed surfaces of the metal foil or the metal coating not covered by the photoresist, a tin layer, upon which in turn bismuth is deposited. If surfaces coated in this way are brought together during stacking the individual reactor planes and the stack is heated, thus a eutectic mixture melting at low temperatures forms at the boundary surface between bismuth and tin. About 58 wt. % of bismuth is contained in this mixture. The mixture has a melting temperature of less than 140° C. The planes can be soldered together at the melting point of the eutectic alloy. Then the connection is heat-treated, wherein bismuth continuses to diffuse into the tin. Thus, the composition of the alloy changes so that the melting point of the metal layer increases. For this reason a soldered connection produced in this way remains resistant to a temperature far above the original soldering temperature after heat treatment. Therefore, there is the additional advantage for later joining the reactor stack that the application of a solderable and temperature-resistant layer can be simply integrated in the overall process. Moreover, tin may also be applied to areas of one side of the planes and bismuth to the corresponding areas of the other side, which sides are lying on top of one another during stacking, so that the low temperature melting eutectic is again formed upon heating. Naturally, eutectics forming metals other than tin and bismuth may be used.

In addition, further metal layers can be deposited on the metal surfaces provided, that specific requirements of the particular case of application have this as a pre-condition. Thus, for example, layers being particular corrosion-proof and resistant to abration, such as of chrome, nickel/phosphorous alloy or palladium, or surfaces of catalytically active metal and compounds thereof (e.g. platinum, palladium, rhodium, iridium, ruthenium, copper, silver, iron, nickel, cobalt, vanadium, chromium, tungsten, molybdenum, alloys and compounds e.g. complexes thereof), can be deposited on the surfaces of the fluid ducts and/or the closing segment in an electrolytic or electroless manner. The catalytically active metals, alloys and compounds can also be applied an oxide surfaces. For this purpose the carrier made of copper or aluminium for example, is oxidized on the surface and subesquently the catalytic creatings are formed. Also magnetic layers, for example of a ferromagnetic nickel/cobalt alloy can be necessary for specific applications, such as for the use of magnetic valves as actors. Furthermore, the surface structure can be roughened or smoothed also by etching techniques.

To produce complex three-dimensional fluid duct structures in the microreactor, connections must be formed between the various duct planes, if necessary. For this purpose continuous structuring of the substrate material is necessary. This can be brought about before assembling the individual planes to form a stack either in a serial process such as by laser drilling or mechanical drilling. Alternatively it is also possible in a second photostructuring process after formation of the fluid ducts, to leave those points of the reactor planes unprotected, which are further ablated in a second etching process, until the substrate material at this point has a continuous connection to the opposite side of the substrate.

Figure 3:
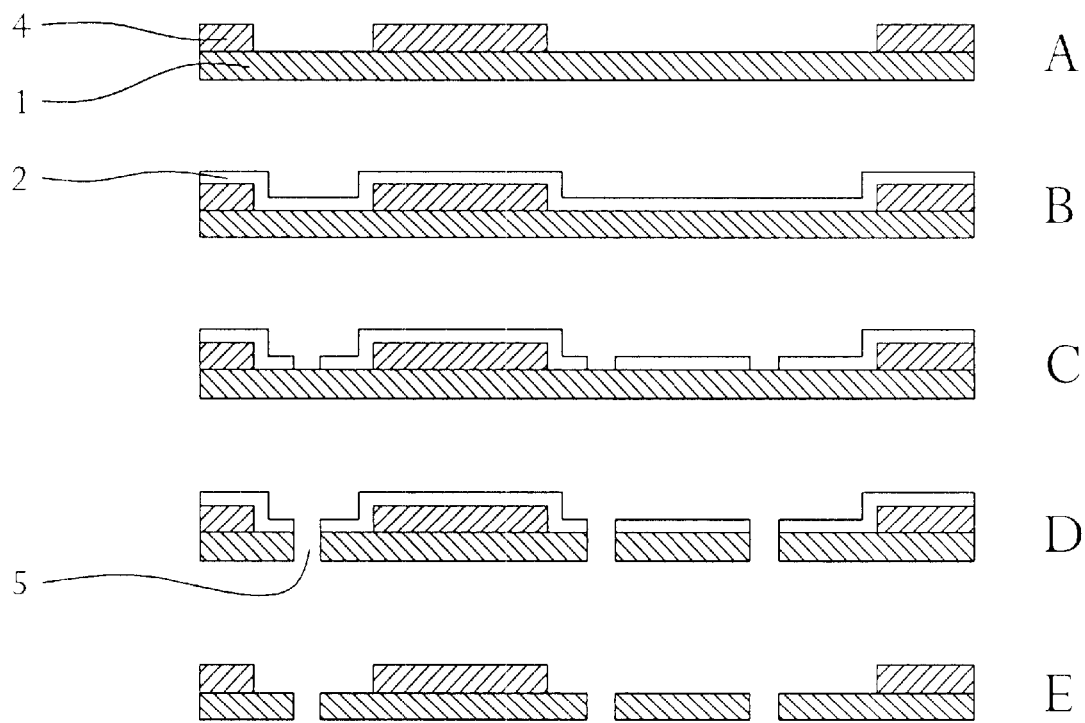
FIG. 3 shows a formation of continuous perforations through a microreactor substrate material.

FIG. 3 shows diagramatically the formation of continuous perforations through the substrate material. According to this, the substrate comprising, for example a metal core 1 and structures 4 consisting of metal, are coated by a photoresist layer 2 (process step B in FIG. 3). This layer is exposed by exposing with an appropriate layout and developed, so that bare areas of the metal core (process step C) arise at those points at which the continuous perforations are to be formed. Then, the metal core is etched, forming clearance holes 5 (process step D) and thereafter the photoresist layer is again removed (process step E).

Such etching methods can also be used in order to totally remove the metal in specific layers of the microreactor consisting of a plurality of substrates, by etching it off in defined areas. Thus, translucent windows can be formed, to pass a light beam from a light source through a fluid duct, for example. By means of such windows, which are preferably formed by a transparent layer of plastic in order to prevent the passage of liquid, analyses can be carried out by means of a measurement of light absorption or emission, if an appropriate light sensor is additionally provided. Such sensors can also be produced by lightconductive layers within the planes.

When pure metal foils are used, chemical and electrochemical methods are principally used as etching methods. For copper foils for example, a hydrochloric solution of copper (I)-chloride or iron (III)-chloride can be used. For aluminium foils an alkaline solution is suitable. When plastics carriers, for example of polyimide, are used, a chemical method with alkaline etching solutions, a plasma or a laser etching method can be used. The passage holes between the reactor planes can also be formed in the multiple printed panel, so that in turn the advantage of saving of time and uniformity of the etching method exists for all clearance holes. Contrary to mechanical drilling devices, etching devices can be operated continuously without problems. An interruption of production as frequently occurs with drilling due to a defective tool, can be eliminated.

In addition, photostructuring enables the production of connecting ducts which are considerably smaller than the ducts produced by mechanical drilling. This permits the build-up of a finely structured three-dimensional connecting network. This is necessary if a reactor stack not only does consists of the layering of identical reactor chambers, but contains additional components, for example for chemical analysis or for monitored metering of further substances. Hence in all it is advantageous if the technique for interconnecting the individual planes permits the same structural variety and precision as that used in structuring the planes.

Preferably, larger multiple blanks of the substrate with a plurality of plane elements of the reactor are processed in a continuous system with horizontal transport. Such systems are known from the manufacture of printed circuit boards. In this way a uniform and rapid treatment of all the substrates passing through is achieved.

Figure 4:
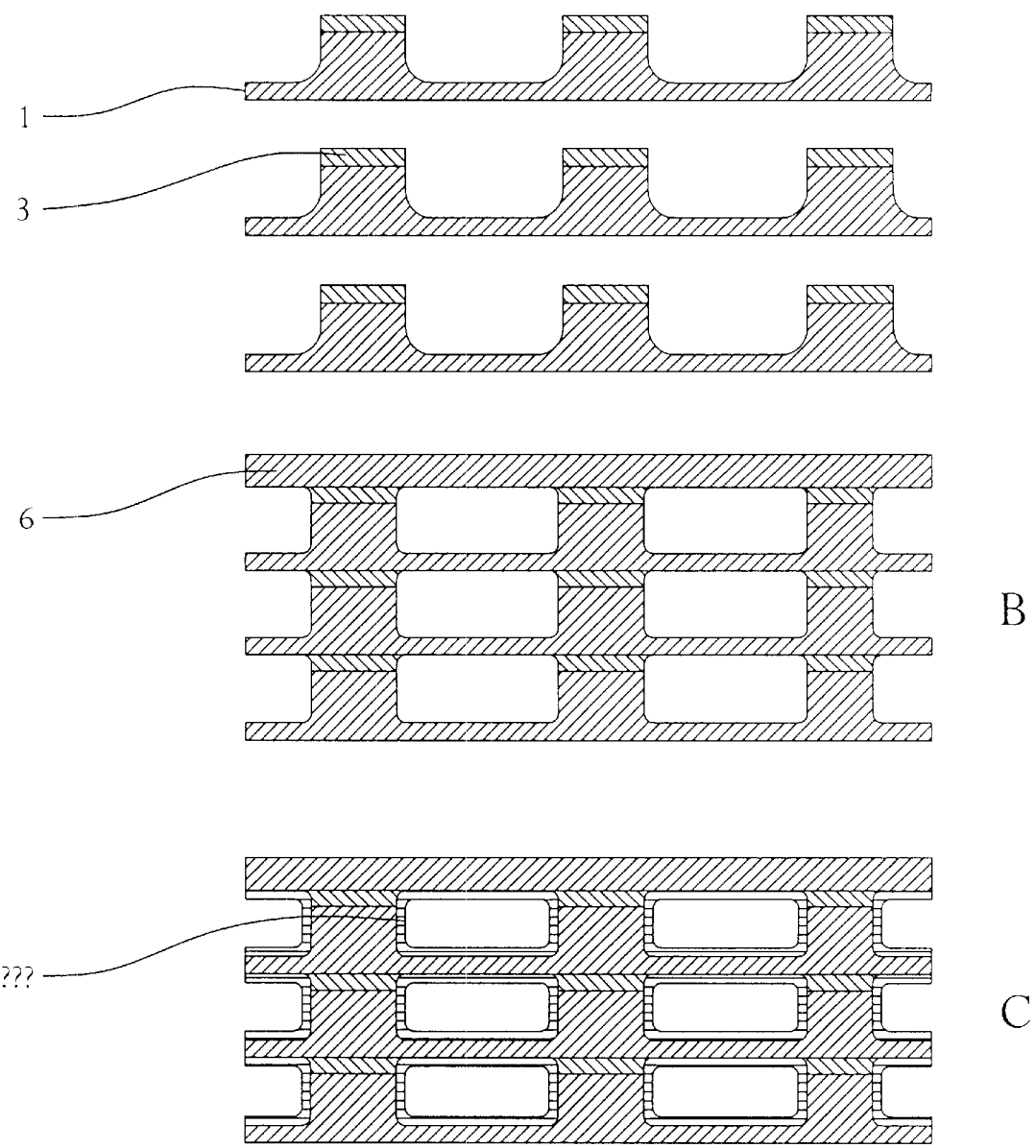
FIG. 4 shows a method of forming a microreactor stack.

In order to provide adaptation to the desired flow of fluid, an appropriate number of planes must be integrated into a stack. FIG. 4 shows the formation of a stack of three elements. Proceeding from individual layers 1 and a closing segment 6 closing the fluid ducts, a stack is formed which is subsequently soldered for example by heating by means of the solder layer 3 (process step B in FIG. 4). Such stacks then can be considered again as reactor modules and can be interconnected to larger blocks, if necessary.

With joining the reactor planes into stacks, two conditions must be fulfilled: on the one hand fixing the planes against each other, and on the other hand sealing the flowed structures. It is favourable to close the stacks by front plates which are so designed that they are able to absorb the forces arising during operation of the reactor under high pressure. A plurality of planes are integrated to form a stack in such a way that the planes are secured and sealed with positional accuracy relative to one another. For this purpose appropriate registering elements are used. Techniques known from the manufacture of printed circuit boards and semiconductors, such as the application and use of so-called tooling holes or optical markers are particularly suitable.

According to DIN 8593 the planes can be joined by soldering or by bonding. Selection of the technique depends on the operational parameters of the microreactor. Important operational parameters are the temperature, the pressure, mechanical stresses and the chemical composition of the reaction components. Preferably, a soldering process is used because a preparation of a soldering process by deposition of appropriate solder layers can be integrated into the manufacturing process when the reversal method is used.

Adhesive layers for example can be applied by the screen-printing method. Among other things, adhesives on the basis of epoxy resins, acrylate resins, e.g. also cyanoacrylate resins, polyesters, polyurethanes, amino resins and phenolic resins are used. Due to their chemical resistance, epoxy resins are preferred. In the case of a subsequent pre-treatment of the fluid duct surfaces and deposition of metal layers on these surfaces, the front faces of the adhesive layers exposed to the fluid however can be sealed, so that the chemical compatibility with the fluids is of no importance.

As during operation of the microreactor at the front faces of the stack under pressure forces arise which would exceed the mechanical stability of the external microstructured planes, suitably dimensioned front plates terminating the stack must be provided. These absorb the forces. Relative fixation of the front plates can be provided by appropriate screwing techniques, for example. In a preferred embodiment, after joining the reactor the chemical and morphological structure of the internal reactor surface can be modified. For this purpose appropriate fluid (liquid, gas) is passed through the reactor. Such a process sequence is necessary when the process parameters used during jointing are not compatible with the surfaces optimum for the reaction. For example, the solderable intermediate layer can be coated by electroless application of a chemically resistant nickel alloy layer 7 (process step C in FIG. 4). If furthermore a temperature increase occurs during jointing, the surface morphology of the metal surface can alter disadvantageously due to recrystallization. In such a case it is possible to optimize the surface structure by passing through an appropriate etching solution, e.g. for enhancing the surface roughness, or by depositing a further metal layer. The chemical composition of the surface can also be disturbed by the jointing process. For example, a catalyst surface consisting of a plurality of phases can alter disadvantageously due to phase change. Carrier-mounted catalysts are likewise extremely sensitive to changes in temperature.

In particular, the inner surfaces of the microreactor then can be subsequently coated by an additional metal layer as well if by means of the jointing technique only an insufficient seal is achieved against the fluid flows, which are usually passed through the ducts under pressure. In such a case, for example, the insufficiently sealed joints between the planes can be subsequently sealed by a layer of an electroless deposited metal layer, for example a copper or nickel layer.

With a logical use of the opportunities arising from a three-dimensional connecting structure, multi-functional reactor types can be produced. In these, different functional areas are interlinked with one another in a complex manner. Thus it is possible to produce multi-stage synthesis reactors, consisting of cascade connections of mixing, heat exchanger and reaction zones. In such a module the three-dimensional image of the duct structures is produced after the optimum arrangement of the various zones. A module may be defined similarly to a microelectronic component via its inputs and outputs. Such modules can further be combined to form new reactors.

The microreactors produced with the method according to the invention can be used in particular for producing toxic, unstable or explosive chemical products according to known synthesis methods. As a result the separate manufacture of these compounds is avoided, so that dangerous storage is eliminated. If in this case the further processing of specific intermediate products is involved, these compounds are produced on the production site for the end product and are passed directly thereafter into the reactor of the production system. As such compounds are frequently unstable, there is no risk that portions of the intermediate product produced will decompose again before being further processed. Furthermore, dangerous intermediate products as well need no longer be separately treated, such as for preparation and with the storage.

In the following examples of manufacture are given for further explanation of the invention.

EXAMPLE 1

Manufacture of a Microreactor by Using the Etching Method and Connection of Individual Reactor Planes by Soldering The etching technique was used to manufacture a microreactor/heat exchanger in fine pattern technology.

Figure 5:
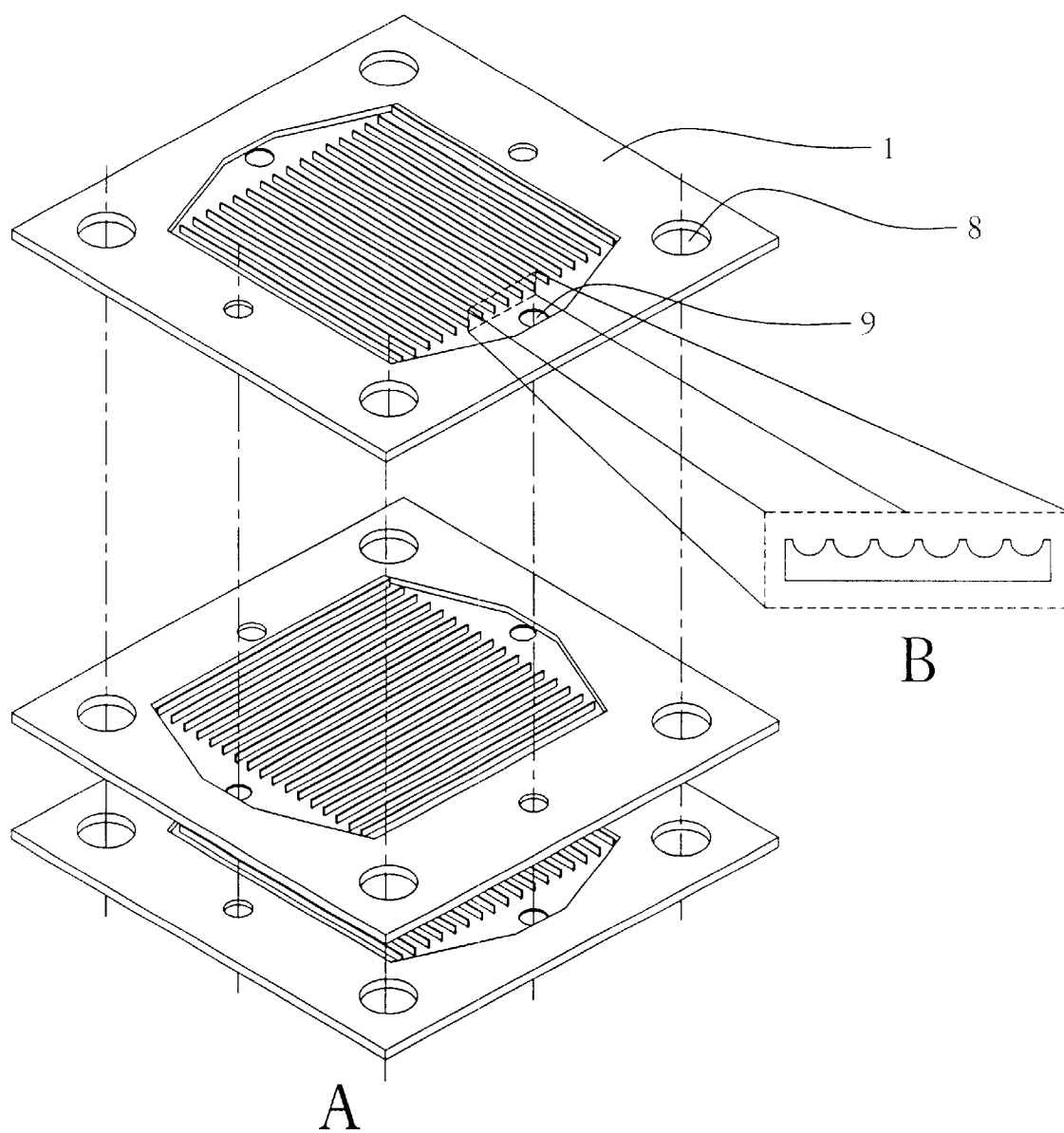
FIG. 5 shows an arrangement of microreactor copper plates.
Figure 4:
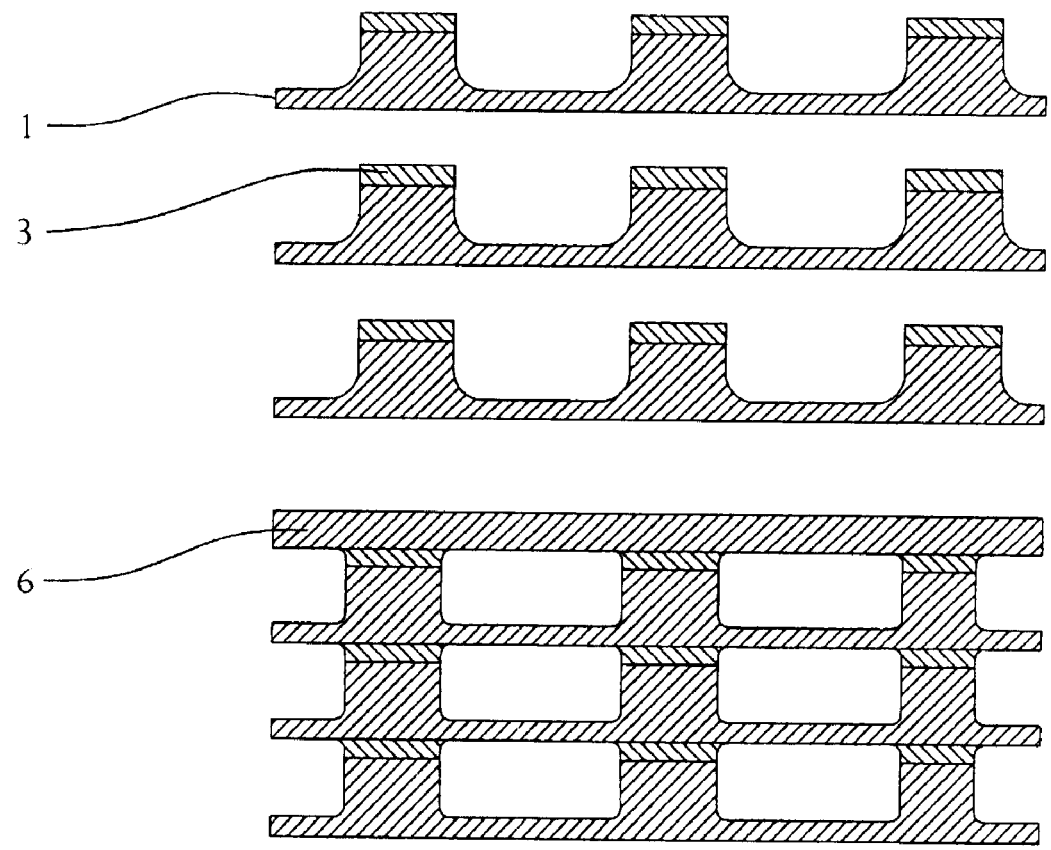
Figure 4:
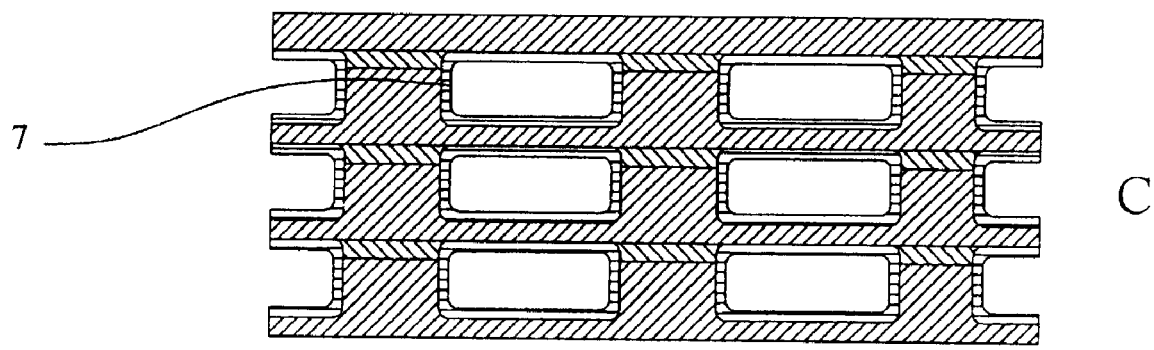

FIG. 5 schematically shows in a detail the arrangement of three successive copper plates.

The microreactor was made up of a stack of sixty copper plates 1. The plates have been structured such that a gas or liquid flow can pass through in one direction. The layers have been respectively stacked rotated through 90° to one another. Thus a plate heat exchanger for counter current has been formed.

Copper plates having a thickness of 125 $\mu$m with respective dimensions of 150 mm×150 mm have been used as a substrate material for manufacturing the heat exchanger. Four respective plates for the heat exchanger have been produced from these plates.

The first manufacturing step consisted in the application of a photosensitive, negatively operating dry film resist (for example Riston® 4630 of Du Pont de Nemours Inc., USA). After exposure of the resist with the layout and processing, copper was uniformly removed by etching to a thickness of 60 $\mu$m from the exposed areas in a copper etching solution. As a result a duct structure was developed with a duct width of about 430 $\mu$m, which was predetermined by the layout, a duct depth of 60 $\mu$m and a web width of 70 $\mu$m. Thereafter, the photoresist was removed from the entire surface again.

Subsequently a tin/lead layer, 4 $\mu$m thick was applied to the structured copper plates.

Thereafter the copper plates were cut into four segments, which have corresponded to the individual layers in the reactor packet. The segments have been identically structured and were stacked in the prescribed way.

As end plates of the stack, stainless steel plates 5 mm thick were used. The stack was screwed together by four M8 screws located at the corners. The holes 8 necessary for this, like the necessary gas or liquid passages 9, were drilled into the copper and stainless steel plates. In the final step the copper plates were soldered together by heating the stack to 300° C., so that the tin/lead layer became liquid on the individual copper planes.

A stack produced in this way comprised 2640 ducts respectively for each flow direction with a cross-sectional area of 0.7 cm$^2$ respectively. The entire inner area came to 3000 cm$^2$. The inner area was covered with a tin/lead layer, 4 $\mu$m thick.

For a special application for use in a chemical synthesis, the tin/lead layer was removed by passing through a tin/lead etching solution which does not affect copper. In a further method step an extremely thin palladium layer was applied by cementative metal deposition (e.g. 0.02 $\mu$m thick). The microreactor could then be used for carrying out heterogeneously catalyzed reactions. As the copper plates separating the individual planes had a very high heat transfer coefficient, such a microreactor was particularly suitable for highly endothermic or exothermic reactions.

EXAMPLE 2

Manufacture of a Microreactor by using the Reversal Method and Connection of the Reactor Planes by Soldering In a first manufacturing step, a photosensitive dry film resist (Laminar® HG 2.0 MIL of Morton International GmbH DE), was applied to a copper substrate (corresponding to method step A in FIG. 1). After exposure of the resist with the layout (surface areas corresponding to the fluid ducts to be produced were not covered with resist) and subsequent development, a tin/lead layer 6 $\mu$m thick was applied by electroplating in the exposed areas (according to method steps B and C in FIG. 1). This layer served both as an etching resist in the subsequent structuring and as a soldering layer for joining the individual layers. Subsequently the dry film resist was again totally removed (according to method step D in FIG. 1). A treatment with a copper etching solution (iron (III)-chloride/hydrochloric acid) followed by means of which the areas not covered by the tin/lead layer were etched off within a thickness of 60 $\mu$m (according to method step E in FIG. 1).

Then, the copper plates carrying a quadruple copy blank were cut into four identically structured segments. Forty of these individual layers were stacked as in the manufacturing example 1 after the incorporation of registering, assembly and flow bores (according to method step F in FIG. 1), screwed between two stainless steel plates coated with copper, wherein one of them served as the closure segment closing the uppermost fluid ducts, and finally soldered together by heating to about 300° C.

The inner surface of the ducts thus produced was not coated with a tin/lead layer and could therefore be coated directly by cementative metal deposition with a thin palladium layer (from an aqueous PdSO$_4$/H$_2$SO$_4$ solution), for carrying out a catalyzed chemical reaction.

EXAMPLE 3

Manufacture of a Composite Microreactor by using the Additive Process and Connecting the Reactor Planes by Gluing In a first manufacturing step a dry film resist 100 μm thick was applied to a polyimide film (Kapton®-H of DuPont de Nemours Inc., USA) coated on both sides with a copper foil 25 μm thick. After exposure of the resist with the layout according to FIG. 5 and subsequent development of the resist, wherein those points on the copper surfaces which have been exposed should not correspond to the fluid ducts to be formed, a copper layer, 80 μm thick was electrolytically deposited in the bare areas. The resist was then removed.

The copper substrates in turn produced in quadruple copy panels, were cut into four identical structured segments. Twenty of these individual layers have been stacked as in manufacturing example 1 after the incorporation of registering, assembly and flow bores.

In this stack a single layer of fluorinated polyethylene (FEP) was integrated after the pre-treatment described in the following:

The FEP layer, about 1 mm thick (same size and bores as the copper layers) was coated with palladium catalyst, in a radio frequency plasma (PECVD) using organo metallic additives (π-allyl-π-cyclopentadienyl-palladium-(II)), the catalyst layer was metallized in an electroless nickel bath having sodium hypophosphite as a reduction agent with a nickel-phosphorous layer about 1 μm thick, and thereupon a copper layer, about 30 μm thick was applied electrolytically from a sulphuric copper bath. The copper and nickel/phosphorous layers were structured with the layout of an appropriate electronic circuit according to known methods of printed circuit board technology. Thereafter electronic components such as semiconductor components (microchips) were mounted in the FEP layer and connected to control and signal lines by bonding and soldering methods, respectriely.

Both on twenty of the structured polyimide/copper layers and also on the FEP layer, a two-component adhesive on an epoxy resin base was thinly applied in the lateral areas outside the duct structures. The copper layers with the FEP layer in the middle were stacked together, the stack was screwed between two stainless steel plates coated with copper and glued together.

All the disclosed features as well as combinations of the disclosed features are the subject-matter of this invention, insofar as they are not expressly referred to as known.

What is claimed is:

1. Manufacturing process for chemical microreactors including at least one substrate with a metal coating on at least one side thereof, the process forming fluid ducts as well as feeding and drain ducts for fluids, without using plastic molding techniques comprising the following steps of:
   a.) coating with a resist layer in a pattern forming fluid duct structures for forming fluid ducts on a metal surface located on each substrate by layering means selected from a group consisting of photoresist layering and screen-printed varnish layering, so that the metal surfaces are partly covered by the resist coating layer;
   b.) removing metal from each uncoated metal surface of each substrate by a process selected from the group consisting of electroless and electrochemical etching;
   c.) totally removing the resist coating layer;
   d.) forming solder layers by depositing metals that can form eutectics;
   e.) superimposing each substrate and a closure segment closing the fluid ducts, and interconnecting each substrate and the closure segment by soldering.

2. Manufacturing process for making chemical microreactors, which microreactors include at least one metal surfaced substrate with fluid ducts as well as feeding and drain conducts for fluids, without using plastic molding techniques, comprising the following steps of:
   a.) forming a fluid duct pattern for forming fluid ducts on a metal surface located on the substrate by layering means selected from a group consisting of photoresist layering and screen-printed varnish layering, so that the substrate metal surfaces are partly covered by the layering;
   b.) depositing of a further metal layer on the unlayered metal surfaces of the substrate by depositing means selected from the group of electroless and electrochemical deposition to form fluid duct structures thereon;
   c.) totally removing the layering from the substrate metal surfaces;
   d.) forming additional substrates according to steps a.) to c.);
   e.) forming solder layers by depositing metals that can form eutectics on each substrate;
   f.) superimposing the substrates and a closure segment closing the fluid ducts, and interconnecting the substrates and the closure segment by soldering.

3. Method according to claim 2 characterized in that in step b.) the deposited further metal layer is selected from the group consisting of tin, lead, nickel, cobalt, bismuth, silver, gold, and alloys of these metals.

4. Method according to claim 3, characterized in that the substrates are interconnected by the soldering connection of deposited further metal layers deposited on each metal sufaced substrate under the action of heat.

5. Method according to any one of claims 3 to 4, characterized in that in step b.) a tin layer is applied to a first side of each substrate and a bismuth layer is applied to a second side of each substrate, and in that plural substrates are placed upon one another such that tin and bismuth layers lie adjacent one another and are thereby subsequently soldered together during the soldering step f.).

6. Manufacturing method for chemical microreactors, including a least one metallic substrate, for providing a microreactor with fluid ducts as well as feeding and drain conducts for fluids, without using plastic molding techniques, comprising the following steps of:
   a.) forming fluid duct structure patterns for forming fluid ducts on surfaces of the metallic substrate by resist layering means selected from the group of photoresist layering and screen-printed varnish layering, so that the substrate metallic surfaces are partly covered by the resist layer;
   b.) depositing a metal layer on the non-resist layer covered surfaces of the metallic substrate;
   c.) totally removing the resist layer;
   d.) forming solder layers by depositing metal that can form eutectics;
   e.) superimposing each substrate and a closure segment closing the fluid ducts and interconnecting each substrate and the closure segment by soldering.

7. Method according to any one of claims 1 to 6 characterized in that in step a.) the metal surface on the substrate is coated with a photoresist layer, wherein the photoresist layer is exposed with an image being one of the group consisting of a positive image and a negative image of a pattern structure of the fluid ducts, and the photoresist layer is subsequently developed.

8. Method according to any one of the preceding claims 1 to 6 wherein the substrate metal surfaces consist of at least one metal selected from the group consisting of steel, stainless steel, copper, nickel and aluminum.

9. Method according to any one of the preceding claims 1 to 6, characterized in that passages are formed inside each substrate by performing steps a.) through c.).

10. Method according to any one of the preceding claims 1 to 6, characterized in that after superimposing and interconnecting each substrate surfaces of the fluid ducts are modified by a method, selected from the group consisting of metal deposition, metal etching and absorbing of chemical compounds.

11. Method according to claim 10, characterized in that the surfaces of the fluid ducts are modified by further deposition of at least one layer selected from the group of layers consisting of:

a.) a metallic layer selected from the group comprising palladium, platinum, rhodium, iridium, ruthenium and alloys of such metals; and b.) a composite layer selected from the group consisting of a nickel/phosphorus alloy corrosion layer and a nickel/phosphorus alloy catalytic layer.

12. Method according to any one of the preceding claims 1 to 6, characterized in that actors are formed in the reactors by application of ferromagnetic metal layers wherein each actor is selected from the group consisting of valves and switches.

13. Method according to any one of the preceding claims 1 to 6, characterized in that sensors for measuring properties are formed in the reactors wherein each sensor is selected from the group consisting of sensors for measuring flowing fluids and sensors for measuring electrical line flow.

14. Method according to any one of the preceding claims 1 to 6, characterized also to include actors formed in the reactors selected from the group consisting of electrical resistive heating systems and cooling elements.

15. Method according to any one of the preceding claims 1 to 6, characterized in that for individual superimposed substrate layers of the microreactor, the metal is totally removed in defined areas of each substrate by etching-off in order to form translucent windows.

16. A process for manufacturing a chemical microreactor, comprising the steps:

a. obtaining at least one substrate having a first and second opposite surfaces;

b. metal coating at least a first surface of each obtained substrate;

c. obtaining at least one closure segment;

d. selecting substrates and coating each selected substrate's metal coated surface with a resist pattern defining fluid duct structures, and developing the coated resist pattern to provide a resist protective coating;

e. metal treating each selected substrate's metal coated surface adjacent said resist layer protective coating on surface portions absent said resist protective coating;

f. removing, totally, each resist protective coating from each selected substrate;

g. superimposing each selected substrate and said closure segment; and h. bonding each superimposed substrate and said closure segment with solder to from said microreactor.

17. The process of claim 16, wherein said solder bonding step includes:

a. after the step of removing the resist protective coating, a step of depositing solder on each selected substrate; and b. wherein the step of bonding with solder includes melting said deposited solder to from said bonding.

18. The process of claim 17, wherein said metal treating step includes the step of removing metal from said substrate's metal coated surface which is absent said resist protective coating.

19. The process of claim 18, wherein said depositing solder step includes depositing a metal on each of said superimposed substrate and closure segment adjacent surfaces which can form an eutectic solder with the metal deposited on an adjacent surface of said adjacent substrate and closure segment when melted.

20. The process of claim 17, wherein said metal treating step includes the step of depositing further metal on said substrate's metal coated surface which is absent said resist protective coating.

21. The process of claim 20, wherein said depositing solder step includes depositing a metal on each of said superimposed substrate and closure segment adjacent surfaces which can form an eutectic solder with the metal deposited on the adjacent surface of said adjacent substrate and closure segment when melted.

* * * * *

UNITED STATES PATENT AND TRADEMARK OFFICE
CERTIFICATE OF CORRECTION

PATENT NO. : 6,409,072 B1
DATED : June 25, 2002
INVENTOR(S) : Breuer et al.

It is certified that error appears in the above-identified patent and that said Letters Patent is hereby corrected as shown below:

Title page,
Item [56], References Cited, OTHER PUBLICATIONS, please delete "Dhrfeld" and replace it with the word -- Ehrfeld --.

Column 1,
Line 11, delete the word "micro reactors" and replace it with the word
-- microreactors --;
Line 67, please delete the word "arragement" and replace it with the word
-- arrangement --;

Column 5,
Line 21, please delete the word "advatagerus" and replace it with the word
-- advantageous --;
Line 29, please delete the word "Advantagerus" and replace it with -- Advantageous --;
Line 41, please delete the word "bouding" and replace it with the word -- bonding --;
Line 46, please delete the word "temperaturesensitive" and replace with the word
-- temperature-sensitive --;

Column 6,
Line 36, please delete the word "temperaturesensitive" and replace with the
word -- temperature-sensitive --;
Line 59, please delete the word "respectibely" and replace it with -- respectively --;

Column 7,
Line 20, please delete the word "metallizeing" and replace it with the word
-- metallizing --;
Line 20, please delete "F or" and replace it with the word -- For --;

Column 8,
Line 56, please delete the word "selectable" and replace it with the word
-- selectable --;
Line 65, please delete the word "ageing" and replace it with the word -- aging --;

Column 9,
Line 59, please delete the word "methode" and replace it with the word -- method --;

Column 10,
Line 24, please delete the word "continuses" and replace it with the word
-- continues --;
Line 52, please delete the word "an" and replace it with the word -- to --;

UNITED STATES PATENT AND TRADEMARK OFFICE
CERTIFICATE OF CORRECTION

PATENT NO. : 6,409,072 B1
DATED : June 25, 2002
INVENTOR(S) : Breuer et al.

It is certified that error appears in the above-identified patent and that said Letters Patent is hereby corrected as shown below:

Column 11,
Line 27, please delete the word "lightconductive" and replace it with the word
-- light-conductive --;
Line 52, please delete the word "consists" and replace it with the words -- consist --;

Column 15,
Line 40, please delete the word "respectriely" and replace it with the word
-- respectively --;
Line 44, please delete the word "outsidle" and replace it with the word -- outside --;
Line 61, please delete the letter "a" and replace it with -- the --;

Column 18,
Line 20, please delete the word "from" and replace it with -- form --;
Line 27, please delete the word "from" and replace it with the word -- form --.

Signed and Sealed this

Twenty-sixth Day of November, 2002

Attest:

JAMES E. ROGAN
Attesting Officer          Director of the United States Patent and Trademark Office

UNITED STATES PATENT AND TRADEMARK OFFICE
CERTIFICATE OF CORRECTION

PATENT NO. : 6,409,072 B1
DATED : June 25, 2002
INVENTOR(S) : Norbert Breuer et al.

It is certified that error appears in the above-identified patent and that said Letters Patent is hereby corrected as shown below:

Drawings,
Drawing Sheet 4 of 5, Fig. 4C, change reference numeral "???" to -- 7 --.

Signed and Sealed this

Ninth Day of May, 2006

JON W. DUDAS
*Director of the United States Patent and Trademark Office*